(12) United States Patent
Shaharabany et al.

(10) Patent No.: US 9,588,701 B2
(45) Date of Patent: Mar. 7, 2017

(54) MULTI-STAGE PROGRAMMING AT A STORAGE DEVICE USING MULTIPLE INSTRUCTIONS FROM A HOST

(71) Applicant: SANDISK TECHNOLOGIES INC., Plano, TX (US)

(72) Inventors: Amir Shaharabany, Kochav Yair (IL); Hadas Oshinsky, Kfar Saba (IL)

(73) Assignee: SANDISK TECHNOLOGIES LLC, Plano, TX (US)

( * ) Notice: Subject to any disclaimer, the term of this patent is extended or adjusted under 35 U.S.C. 154(b) by 194 days.

(21) Appl. No.: 14/481,308

(22) Filed: Sep. 9, 2014

(65) Prior Publication Data

US 2016/0070488 A1  Mar. 10, 2016

(51) Int. Cl.
*G06F 3/06* (2006.01)

(52) U.S. Cl.
CPC ............ *G06F 3/0619* (2013.01); *G06F 3/061* (2013.01); *G06F 3/065* (2013.01); *G06F 3/0659* (2013.01); *G06F 3/0679* (2013.01); *G06F 2206/1014* (2013.01)

(58) Field of Classification Search
None
See application file for complete search history.

(56) References Cited

U.S. PATENT DOCUMENTS

| 6,522,580 B2 | 2/2003 | Chen et al. | |
| 2012/0278664 A1* | 11/2012 | Kazui | G06F 12/0246 714/48 |
| 2013/0238838 A1* | 9/2013 | Fukutomi | G06F 12/0246 711/103 |
| 2013/0282927 A1 | 10/2013 | Zhao et al. | |
| 2014/0063939 A1 | 3/2014 | Marcu et al. | |

* cited by examiner

*Primary Examiner* — Denise Tran
(74) *Attorney, Agent, or Firm* — Toler Law Group, PC

(57) ABSTRACT

A method performed by a data storage device includes receiving, from a host device, a first instruction of a first set of instructions to write a first group of pages of data to a memory of the data storage device and receiving a second instruction of the first set of instructions to write the first group of pages of data. A first stage of a multi-stage programming operation is performed at a first physical address of the memory using a first copy of the first group of pages, and a second stage of the multi-stage programming operation is performed at the first physical address of the memory using a second copy of the first group of pages. The first copy and the second copy are received from the host device in association with the first instruction and the second instruction, respectively.

20 Claims, 5 Drawing Sheets

MULTI-STAGE PROGRAMMING AT A STORAGE DEVICE USING MULTIPLE INSTRUCTIONS FROM A HOST

FIELD OF THE DISCLOSURE

The present disclosure is generally related to programming data at a data storage device.

BACKGROUND

Non-volatile data storage devices, such as universal serial bus (USB) flash memory devices or removable storage cards, have allowed for increased portability of data and software applications. Flash memory devices can enhance data storage density by storing multiple bits in each flash memory cell. For example, Multi-Level Cell (MLC) flash memory devices provide increased storage density by storing 3 bits per cell, 4 bits per cell, or more. Data to be stored in a MLC memory may be first stored in a single-level cell (SLC) cache and later transferred from the SLC cache to the MLC memory during a background process. Alternatively, data may be written to the MLC memory in a direct-write operation.

Storing data in a MLC memory is conventionally performed using multi-stage write operations at multiple adjacent word lines of the MLC flash memory, alternating between the adjacent word lines to reduce an impact of cross-coupling effects. However, alternating between multiple word lines may require swapping data for the different word lines into a set of latches in a flash memory die to enable programming of the latched data to a particular word line. Providing sufficient temporary storage capacity (e.g. in a random-access memory) to store multiple sets of data that is swapped into and out of the latches during a direct-write operation increases the manufacturing cost of a data storage device. Further, repeatedly transferring the temporarily stored data to the latches in the flash memory die during each of multiple write stages for each of the multiple word lines introduces delays associated with the data transfer, increasing latency of writing data to the MLC memory.

SUMMARY

A multi-stage programming operation directly to memory at a data storage device includes receiving multiple copies of write commands from a host device. The data storage device associates each copy of a write command with a particular stage of the multi-stage write programming operation. Data to be programmed at each stage may be retrieved from the host device via the copy of the write command associated with the stage, enabling the data storage device to perform the multi-stage programming operation without requiring the data storage device to have sufficient temporary storage capacity to store the data between stages of the multi-stage programming operation.

DETAILED DESCRIPTION

Figure 1:
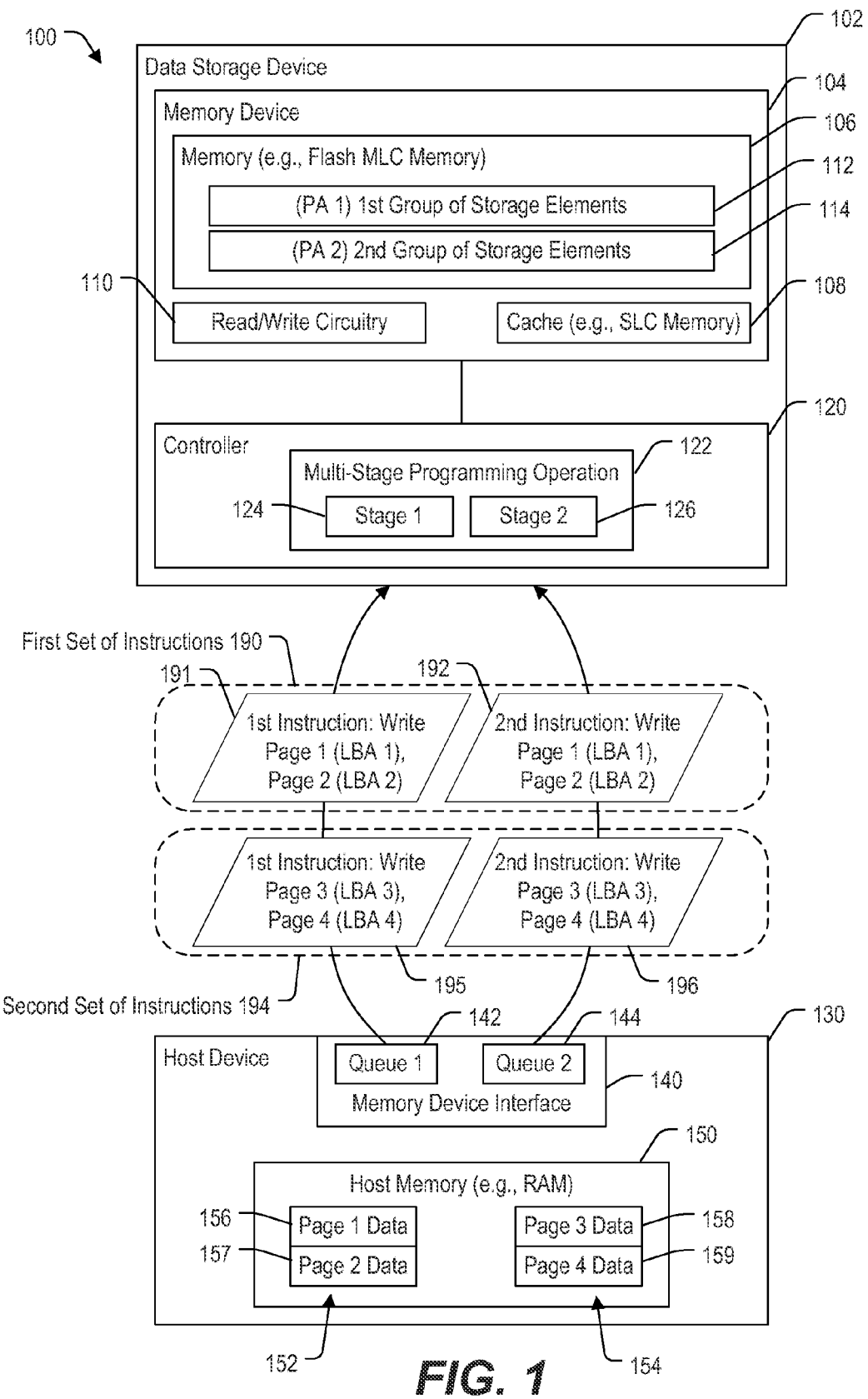
FIG. 1 is a block diagram of a particular illustrative embodiment of a system including a data storage device configured to perform multi-stage programming using multiple instructions from a host.

Referring to FIG. 1, a particular embodiment of a system 100 includes a data storage device 102 coupled to a host device 130. The data storage device 102 is configured to perform multi-stage programming using multiple instructions from the host device 130 for each group of storage elements (e.g., word line) to be programmed in a memory 106. Using multiple instructions from the host device 130 for each group of storage elements to be programmed enables the data storage device 102 to receive, at each stage of a multi-stage programing operation 122, a copy of the data for each group of storage elements from the host device 130. Receiving a copy of the data for each group of storage elements at each stage allows the data storage device 102 to perform the multi-stage programming operation 122 without maintaining the data to be programmed into all target word lines at a cache or other temporary storage.

The data storage device 102 includes a memory device 104 coupled to a controller 120. The memory device 104 includes a memory 106, such as a flash multi-level cell (MLC) memory. The memory 106 includes a representative first group of storage elements 112 and a second group of storage elements 114. For example, the first group of storage elements 112 may correspond to flash MLC cells coupled to a first word line, and the second group of storage elements 114 may correspond to flash MLC cells coupled to a second word line that is adjacent to the first word line. For example, the data storage device 102 may be a memory card, such as a Secure Digital SD® card, a microSD® card, a miniSD™ card (trademarks of SD-3C LLC, Wilmington, Del.), a MultiMediaCard™ (MMC™) card (trademark of JEDEC Solid State Technology Association, Arlington, Va.), or a CompactFlash® (CF) card (trademark of SanDisk Corporation, Milpitas, Calif.). As another example, the data storage device 102 may be configured to be coupled to the host device 130 as embedded memory, such as eMMC® (trademark of JEDEC Solid State Technology Association, Arlington, Va.) and eSD, as illustrative examples. To illustrate, the data storage device 102 may correspond to an eMMC (embedded MultiMedia Card) device. The data storage device 102 may operate in compliance with a JEDEC industry specification. For example, the data storage device 102 may operate in compliance with a JEDEC eMMC specification, a JEDEC Universal Flash Storage (UFS) specification, one or more other specifications, or a combination thereof.

The first group of storage elements 112 is associated with a first physical address (PA 1), such as a word line number of the memory 106. Optionally, the first physical address (PA 1) may correspond to a word line index, a word line index plus offset, etc. Similarly, the second group of storage elements 114 may correspond to a second physical address (PA 2).

The memory device 104 also includes read/write circuitry 110 and a cache 108. For example, the cache 108 may include temporary storage, such as latches, random-access memory (RAM), and/or a non-volatile memory, such as a single-level cell (SLC) memory. The memory device 104 may be configured to receive data to be stored, and may initially store the data in the cache 108. The cache 108 may maintain the data during one or more stages of the multi-stage programming operation 122.

The controller 120 is further configured to control performance of the multi-stage programming operation 122. The controller 120 is configured to receive data and instructions from and to send data to the host device 130 while the data storage device 102 is operatively coupled to the host device 130. The controller 120 is further configured to send data and commands to the memory device 104 and to receive data from the memory device 104. For example, the controller 120 is configured to send data and a write command to instruct the memory device 104 to store the data to a specified address. As another example, the controller 120 is configured to send a read command to read data from a specified address of the memory 106.

The multi-stage programming operation 122 may be configured to store data into multiple neighboring groups of storage elements, such as the first group 112 and the second group 114, by alternating stages of the multi-stage programming operation 122 between the neighboring groups. To illustrate, the multi-stage programming operation 122 may include performing a first stage 124 of writing first data to the first group 112, followed by performing the first stage 124 of writing second data to the second group 114. After completing the first stage 124 at the second group 114, the multi-stage programming operation 122 may perform a second stage 126 of data storage at the first group 112, followed by the second stage 126 at the second group 114.

To avoid temporary storage of multiple copies of the data to be written to the first group 112 and the data to be written to the second group 114 while each of the multiple stages 124-126 of the multi-stage programming operation 122 is performed, the data storage device 102 may be configured to receive data for each of the groups 112, 114 from the host device 130 at each of the stages 124, 126 (e.g., prior to, or during, each stage 124-126). To illustrate, the data storage device 102 may receive a first set of instructions 190 that includes a first instruction 191 and a second instruction 192. Both the first instruction 191 and the second instruction 192 may be instructions to write a first page of data and a second page of data. To illustrate, the first instruction 191 and the second instruction 192 may be copies (e.g., duplicates) of a single write instruction that are received via distinct command queues of the host device 130. The first page of data has a first logical block address (LBA 1) in the first instruction 191 and in the second instruction 192. Similarly, the second page of data has a second logical block address (LBA 2) in the first instruction 191 and in the second instruction 192. The controller 120 may be configured to map the logical addresses LBA 1 and LBA 2 to one or more physical addresses, such as PA 1. For example, the controller 120 may maintain a logical-to-physical address mapping table.

The data storage device 102 is configured to receive the first instruction 191 and to retrieve or receive data for the first page and for the second page from the host device 130 in association with the first instruction 191. To illustrate, the data storage device 102 may receive the first instruction 191 and request the data for the first page and the second page from the host device 130, such as via a direct memory access (DMA) operation. The received data for the first page and the second page may be used for performing the first stage 124 of the multi-stage programming operation 122 at the memory 106. The data storage device 102 may further be configured to receive the second instruction 192 and, when the multi-stage programming operation 122 is to perform the second stage 126 to store the first group of pages (i.e., Page 1, Page 2), the data storage device 102 may retrieve a second copy of the data of the first group of pages for performing the second stage 126.

Similarly, the data storage device 102 may be configured to receive a second set of instructions 194 to store a second group of pages of data to the memory 106. For example, the second group of pages of data may include a third page (Page 3) corresponding to a third logical block address (LBA 3) and a fourth page (Page 4) corresponding to a fourth logical block address (LBA 4). The second set of instructions 194 may include a first instruction 195 and a second instruction 196. Both the first instruction 195 and the second instruction 196 may be instructions to write the second group of pages of data to the memory 106 and may each identify Page 3 with LBA 3 and Page 4 with LBA 4. To illustrate, the first instruction 195 and the second instruction 196 may be copies of a single write instruction that are received via distinct command queues of the host device 130. The controller 120 may be configured to map LBA 3 and LBA 4 to one or more physical addresses, such as PA 2.

The data storage device 102 may be configured to receive, in conjunction with each instruction 191-192 of the first set of instructions 190, a copy of the first group of pages (i.e., Page 1, Page 2) from the host device 130. For example, the data storage device 102 may receive a first copy of the first group of pages of data with the instruction 191. To illustrate, the first copy of the first group of pages of data may be received as part of the first instruction 191. As another example, the first copy of the first group of pages of data may be retrieved from the host device 130 via a request for the first group of pages of data sent from the data storage device 102 to the host device 130 in response to receiving the first instruction 191. The data storage device 102 may receive a second copy of the first group of pages of data in association with the second instruction 192. For example, the second instruction 192 may include the second copy of the first group of pages of data. Alternatively, the data storage device 102 may request the first group of pages of data in response to receiving the second instruction 192. Similarly, each of the pages of data of the second group of pages of data corresponding to the second set of instructions 194 (e.g., Page 3, Page 4) may be received at the data storage device 102 in association with each of the instructions 195, 196 of the second set of instructions 194 (e.g., by being received with the instructions 195, 196 or requested by the data storage device 102 in response to receiving each of the instructions 195, 196).

By receiving a copy of the pages of data in association with receiving each of the instructions 191-192 of the first set of instructions 190, the data storage device 102 may bypass storing the pages of data during the time period between stages of the multi-stage programming operation 122 and may instead receive multiple copies of the pages of data, each copy received in conjunction with performing a corresponding stage of the stages 124, 126 of the multi-stage programming operation 122.

The host device 130 may be configured to provide data to be stored at the memory 106 or to request data to be read from the memory 106. For example, the host device 130 may include a mobile telephone, a music player, a video player, a gaming console, an electronic book reader, a personal digital assistant (PDA), a computer, such as a laptop computer or notebook computer, any other electronic device, or any combination thereof. The host device 130 communicates via a memory device interface 140 that enables reading from the memory 106 and writing to the memory 106. For example, the host device 130 may operate in compliance with a Joint Electron Devices Engineering Council (JEDEC) industry specification, such as a Universal Flash Storage (UFS) Host Controller Interface specification. As other examples, the host device 130 may operate in compliance with one or more other specifications, such as a Secure Digital (SD) Host Controller specification as an illustrative example. The host device 130 may communicate with the memory device 104 in accordance with any other suitable communication protocol.

The host device 130 includes the memory device interface 140 and a host memory 150. For example, the host memory 150 may be a random-access memory (RAM). The host memory 150 may include the first group of pages of data 152 including the data of the first page (Page 1 data 156) and data of the second page (Page 2 data 157). The host memory 150 may also include the second group of pages 154 including data of the third page (Page 3 data 158) and data of the fourth page (Page 4 data 159).

The memory device interface 140 includes multiple command queues, illustrated as a first queue 142 and a second queue 144. For example, the first command queue 142 and the second command queue 144 may include universal flash storage (UFS) command queues. The host device 130 may be configured to populate the command queues 142-144 with multiple write instructions (e.g., instructions 191, 192, 195, and 196) to assist the data storage device 102 in performing the multi-stage programming operation 122 while avoiding storing, at the data storage device 102, all data for all pages over the duration of the multi-stage programming operation 122. Providing multiple write instructions for each group of pages enables the multi-stage programming operation 122 to be performed at the data storage device 102 without storing the first group of pages 152 and the second group of pages 154 at the data storage device 102 between stages of the multi-stage programming operation 122. Reduced storage requirements may enable the data storage device 102 to have a lower cost as compared to devices that include sufficient RAM to store all data for all stages of a multi-stage write operation. Further description of operation of the system 100 is described in a particular implementation with respect to FIGS. 2-3.

Although the multi-stage programming operation 122 is described as including two stages, in other implementations the multi-stage programming operation may include more than two stages. For example, in the implementation depicted in FIG. 1, the memory 106 may be configured to perform a "coarse" programming in the first stage 124 and a "final" programming in the second stage 126. The stages 124 and 126 may be applied in a two-word line sequence so that the second stage 126 is only performed on word lines whose neighbors are fully programmed or have been programmed to completion of the first stage 124. In an implementation where the memory 106 is configured to perform three-stage programming (e.g., "Lower-Middle (LM)", "Foggy", and "Fine" stages, or "Basic," "Intermediate," and "Fine" stages, etc.), the stages may be applied in a three-word line sequence such as described in further detail with respect to FIGS. 2-3. The disclosed techniques may be extended to implementations of four or more programing stages.

Although host device 130 is illustrated as having two command queues 142, 144, in other implementations the host device may have a single command queue or more than two command queues. In some implementations, the host device 130 provides a copy of each write instruction in a separate command queue for each stage of the multi-stage programming operation 122. However, in other implementations, the host device 130 may provide a greater number of copies than stages of the multi-stage programming operation 122.

For example, the data storage device 102 may further be configured to perform a verify operation upon completion of writing data to the memory 106. The controller 120 may include an ECC engine that is configured to receive data to be stored to the memory 104 and to generate a codeword. For example, the ECC engine may include an encoder configured to encode data using an ECC encoding scheme, such as a Reed Solomon encoder, a Bose-Chaudhuri-Hocquenghem (BCH) encoder, a low-density parity check (LDPC) encoder, a Turbo Code encoder, an encoder configured to encode one or more other ECC encoding schemes, or any combination thereof. The ECC engine may include a decoder configured to decode data read from the memory 106 to detect and correct, up to an error correction capability of the ECC scheme, any bit errors that may be present in the data. The ECC engine may be used in conjunction with a verify operation after completion of writing data using the multi-stage programming operation 122, and the host device 130 may provide an additional instruction in each set of instructions 190, 194 in connection with performance of the verify operation, as described further with reference to FIG. 3.

Figure 2:
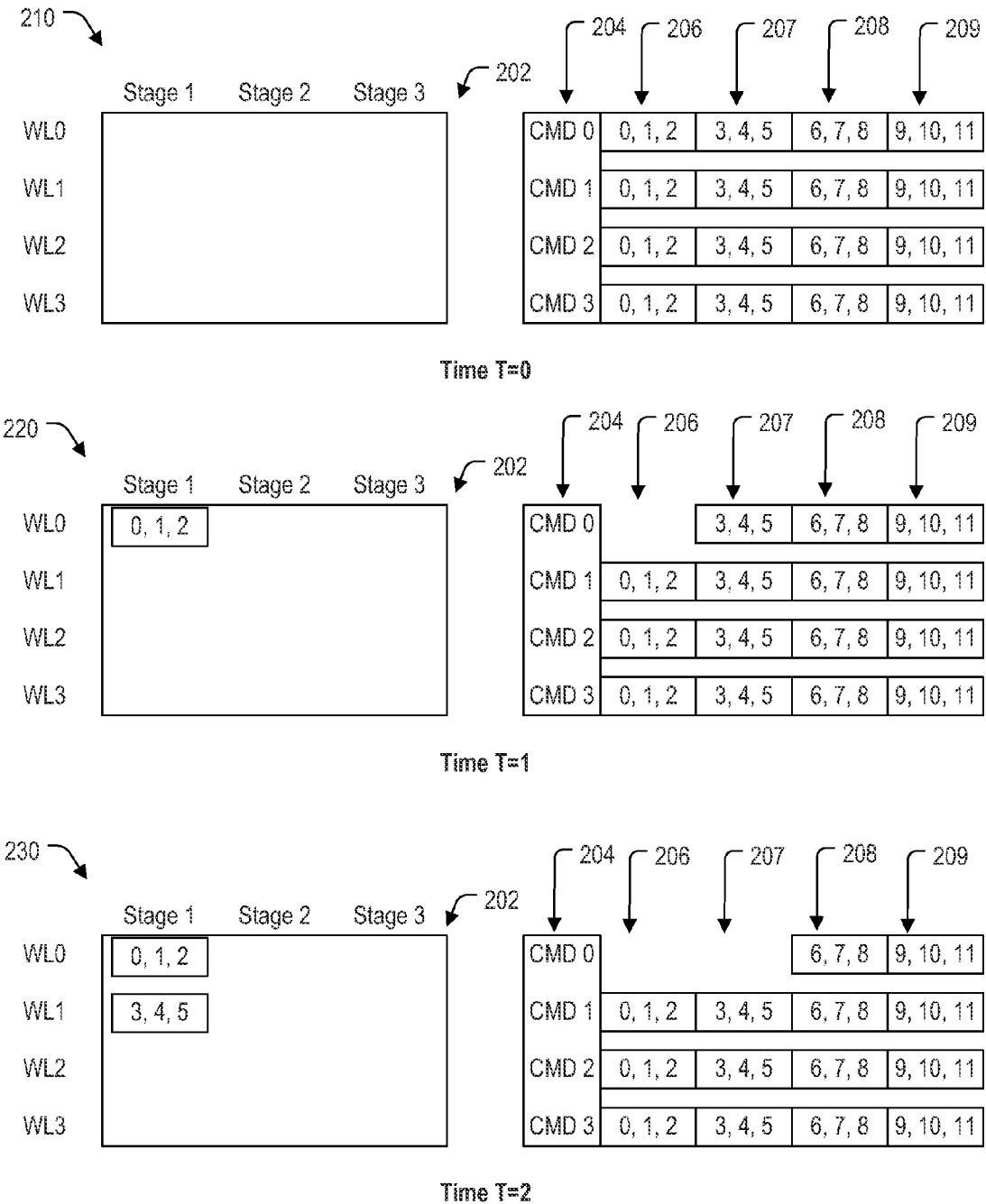
FIG. 2 is a diagram illustrating a status of a memory of the data storage device of FIG. 1 and contents of command queues of a host device at multiple stages of a multi-stage write operation according to a particular embodiment.

Referring to FIG. 2, a diagram of a state of the system 100 of FIG. 1 is illustrated at various times, including a first example 210 at a first time (time T=0). A graphical depiction of a state of the memory 106 is depicted and designated 202, and a graphical depiction of the command queues of the memory device interface 140, denoted CMD 0, CMD 1, CMD 2, and CMD 3, is designated 204. The memory state 202 indicates multiple word lines WL0-WL3 of three stages of a multi-stage programming operation (Stage 1, Stage 2, and Stage 3). For example, the multi-stage programming operation may correspond to the multi-stage programming operation 122 of FIG. 1 including three stages to be performed (as opposed to two stages as illustrated in FIG. 1) with alternating stages performed at alternating word lines as illustrated with respect to FIGS. 2-3. To illustrate, the memory 106 may be configured to store three bits per storage element (e.g., a 3-bits per cell (3-BPC) MLC configuration), and programming may be performed according to a Basic stage (Stage 1), an Intermediate stage (Stage 2), and a Fine stage (Stage 3).

Each of the command queues 204 is illustrated as containing an instruction from a first set of instructions 206, a second set of instructions 207, a third set of instructions 208, and a fourth set of instructions 209. The first set of instructions 206 corresponds to multiple instructions to write a first group of pages of data, illustrated as page number 0, 1, and 2. The second set of instructions 207 corresponds to multiple instructions to write a second group of pages of data. The second group of pages of data includes pages 3, 4, and 5. The third set of instructions 208 corresponds to multiple instructions to write a third group of pages of data including pages 6, 7, and 8. The fourth set of instructions 209 corresponds to multiple instructions to write a fourth group of pages of data including pages 9, 10, and 11.

Each of the command queues 204 may be associated by the data storage device 102 as corresponding to a particular stage of the multi-stage programming operation. For example, the first command queue (CMD 0) may be associated with the first stage (Stage 1), the second command queue (CMD 1) may be associated with the second stage (Stage 2), and the third command queue (CMD 2) may be associated with the third stage (Stage 3). The fourth command queue (CMD 3) may be associated with a verify operation, as described with respect to FIG. 3.

A second example 220 illustrates a state of the system 100 at time T=1. A first instruction of the first set of instructions 206 in the first command queue (CMD 0) has been sent from the host device 130 to the data storage device 102, and the first stage of writing the first group of pages of data to WL 0 has been completed.

A third example 230 at time T=2 illustrates that a first instruction of the second set of instructions 207 has been provided from CMD 0 to the data storage device 102 and the first stage of programming data of the second group of pages of data to WL 1 has been completed.

Figure 3:
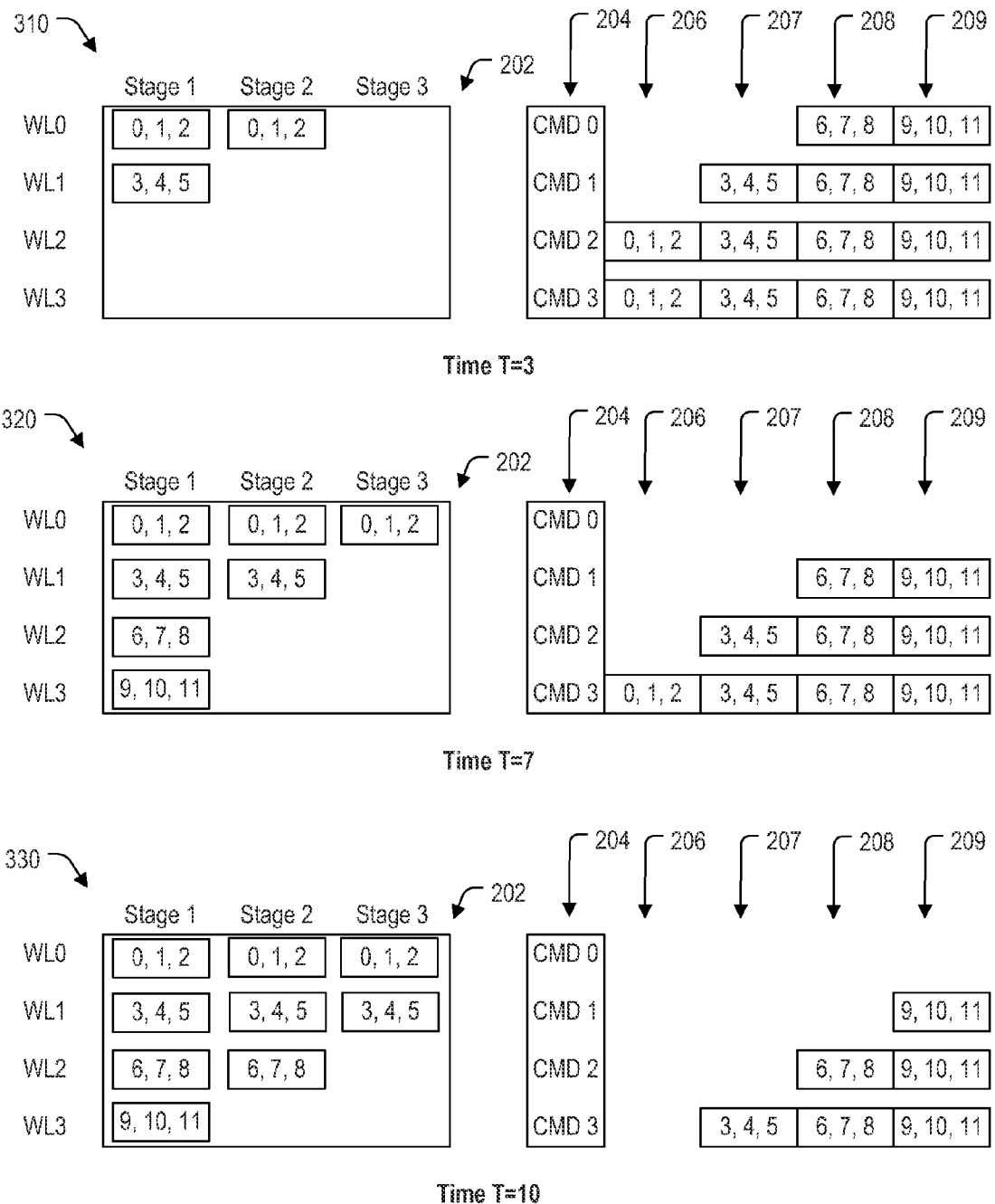
FIG. 3 is a diagram illustrating the status of a memory of the data storage device of FIG. 1 and contents of command queues of the host device at additional stages of the multi-stage write operation of FIG. 2.

Referring to FIG. 3, a fourth example 310 of the system 100 at time T=3 illustrates that the second instruction of the first set of instructions 206 has been provided from the second command queue (CMD 1) to the data storage device 102 and that the second stage of storing the first group of pages of data has been performed at WL 0. At a next sequential time (e.g., T=4), the first instruction of the third set of instructions 208 is provided from CMD 0 to the data storage device 102 to enable completion of the first stage of programming the third group of pages of data to WL 2. At time T=5, the second instruction of the second set of instructions 207 is provided from CMD 1 to the data storage device to enable second stage programming at WL 1. At time T=6, the first instruction of the fourth set of instructions 209 is provided from CMD 0 to the data storage device 102 to enable first stage programming of the fourth group of pages of data at WL 3. For example, in a "steady state" scenario, a sequence of the programming stages may be Stage 1, Stage 2, Stage 3, Stage 1, Stage 2, Stage 3, . . . , and a corresponding word line sequence that the stages are applied to may be WL N+2, WL N+1, WL N, WL N+3, WL N+2, WL N+1, etc.

As illustrated in an example 320, at time T=7, the third instruction of the first group of instructions 206 is provided from the third command queue (CMD 2) to the data storage device 102 and a third stage of the multi-stage programming operation is performed at WL 0. In the example 320, storage of the first group of pages of data at WL 0 using the three-stage programming operation has been completed, storage of the second group of pages of data at WL 1 has two of the three stages completed, storage of the third group of pages of data at WL 2 and storage of the fourth group of pages of data at WL 3 each have a single stage of the three stages completed.

Continuing from time T=7, the sequence of retrieving data from the multiple command queues 204 according to instructions of the various sets 206 to 209 to alternate performance of Stages 1-3 among WL 1-WL 3 continues. Stage 2 programming of the third group of pages of data at WL 2 is performed at time T=8. Stage 3 programming of the second group of pages of data at WL 1 is performed at time T=9.

An example 330 illustrates a particular implementation where data verification is performed on programmed data (i.e. after completion of the third stage of the three-stage programming operation of FIGS. 2-3). In the example 330, at time T=10, the fourth instruction of the first set of instructions 206 is provided from the fourth command queue (CMD 3) to the data storage device 102 to write the first group of pages of data to the data storage device 102. In response to receiving the fourth instruction of the first set of instructions 206, the data storage device 102 may perform a verify operation to determine whether the first group of pages of data is reliably stored in the memory 106. For example, the pages of data may be read from WL 0 and may include parity information that enables the data storage device 102 to determine whether errors are present in the stored data. In response to determining that errors are present (or that a number of errors exceeds an error threshold), the data storage device 102 may request, from the host device 130, data of the first group of pages of data associated with the fourth instruction of the first set of instructions 206.

As another example of the verify operation, the data storage device 102 may read the first group of pages from WL 0 and compare the read data to the data received in association with the fourth instruction of the first set of instructions 206. In response to the verify operation indicating that the first group of pages is not reliably stored (e.g., one or more bits of the stored data does not match the corresponding one or more bits of the received data), the data storage device 102 may store another copy of the first group of pages, such as in the cache 108 or an SLC portion of the memory 106. Although the implementation described with respect to the example 330 illustrates the host device 130 providing an additional instruction to enable the verify operation, in other implementations no verify operation is performed, or no additional instruction is provided in the sets of instructions 206-209 to enable data re-transmission in response to a verify operation indicating that data is not reliably stored.

The technique depicted in FIGS. 2-3 illustrates that the data storage device 102 may perform the multi-stage write operation using data from the host device 130 and without programming and sensing SLC word lines to store and retrieve data between programming stages, which may reduce wear of SLC blocks in the memory device 104. In addition, the controller 120 (and the memory device 104) does not have to store the data between programming stages in a RAM, reducing a cost and area associated with including a large capacity RAM in the data storage device 102.

Figure 4:
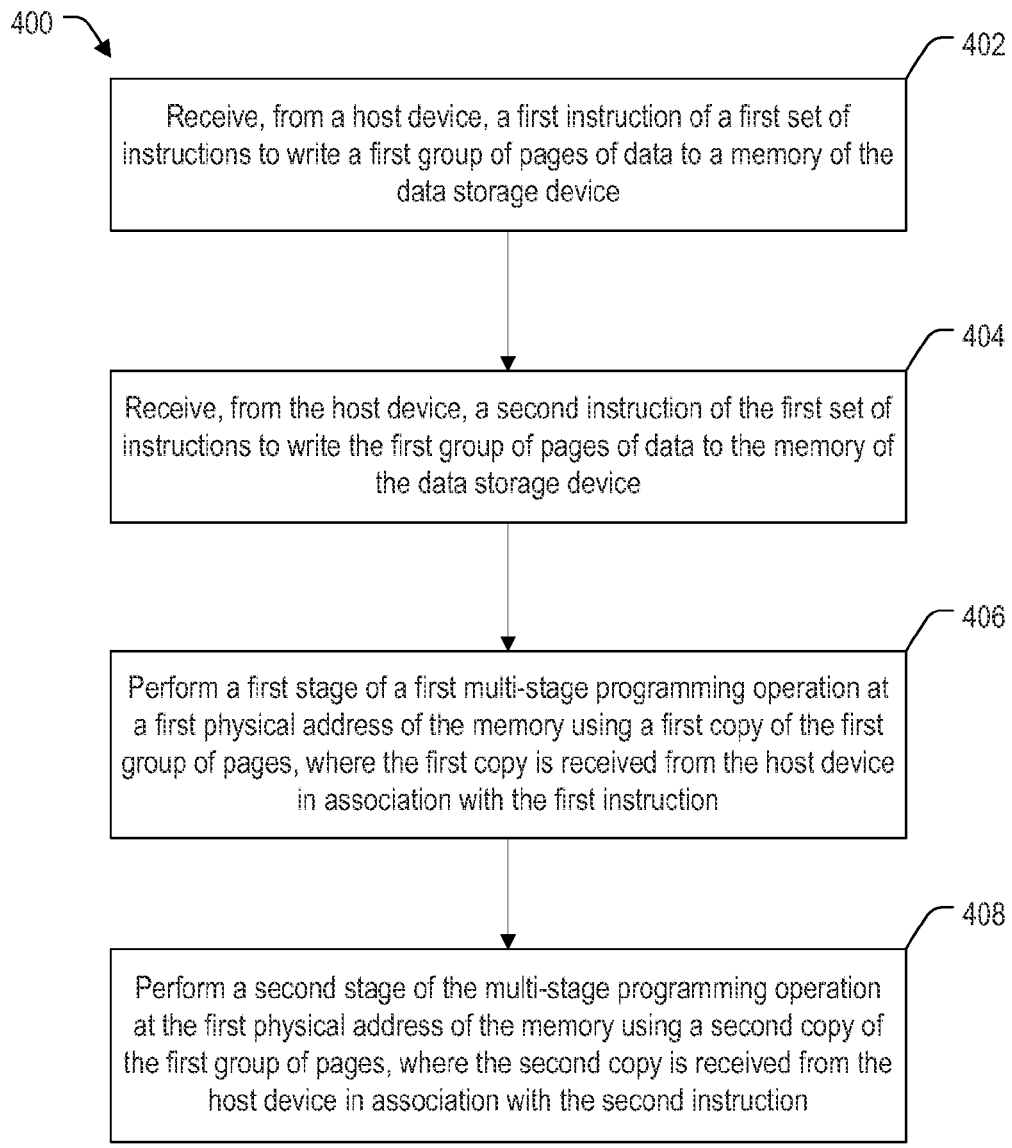
FIG. 4 is a flow chart of a particular illustrative embodiment of a method of multi-stage programming that may be performed by the data storage device of FIG. 1.

Referring to FIG. 4, a flow chart illustrating a method 400 is shown. In particular examples, the method 400 may be performed by the data storage device 102 of FIG. 1. The method 400 includes receiving, from a host device, a first instruction of a first set of instructions to write a first group of pages of data to a memory of the data storage device, at 402. For example, the data storage device 102 of FIG. 1 may receive the first set of instructions 190 from the host device 130. The first set of instructions 190 may include the first instruction 191 to write the first group of pages (i.e., Page 1 and Page 2) to the memory 106 of the data storage device 102.

The method 400 further includes receiving, from the host device, a second instruction of the first set of instructions to write the first group of pages of data to the memory of the data storage device, at 404. For example, the data storage device 102 may receive, as part of the first set of instructions 190, the second instruction 192 to write the first group of pages (i.e., Page 1 and Page 2) to the memory 106.

The method 400 further includes performing a first stage of a first multi-stage programming operation at a first physical address of the memory using a first copy of the first group of pages, where the first copy is received from the host device in association with the first instruction, at 406. For example, the controller 120 of the data storage device 102 may perform the multi-stage programming operation 122. The multi-stage programming operation 122 may include the first stage 124 and the second stage 126. The controller 120 may perform the first stage 124 at the first group of storage elements 112 of the memory 104 based on the first group of pages received with the first instruction 191.

The method 400 further includes performing a second stage of the multi-stage programming operation at the first physical address of the memory using a second copy of the first group of pages, where the second copy is received from the host device in association with the second instruction, at 408. For example, the controller 120 may perform the second stage 126 at the first group of storage elements 112 of the memory 104 based on the first group of pages received with the second instruction 192 or retrieved in response to receiving the second instruction 192. Thus, the method 400 may enable a multi-stage programming operation to be performed at a data storage device without storing a group of pages at the data storage device between stages of the multi-stage programming operation.

Figure 5:
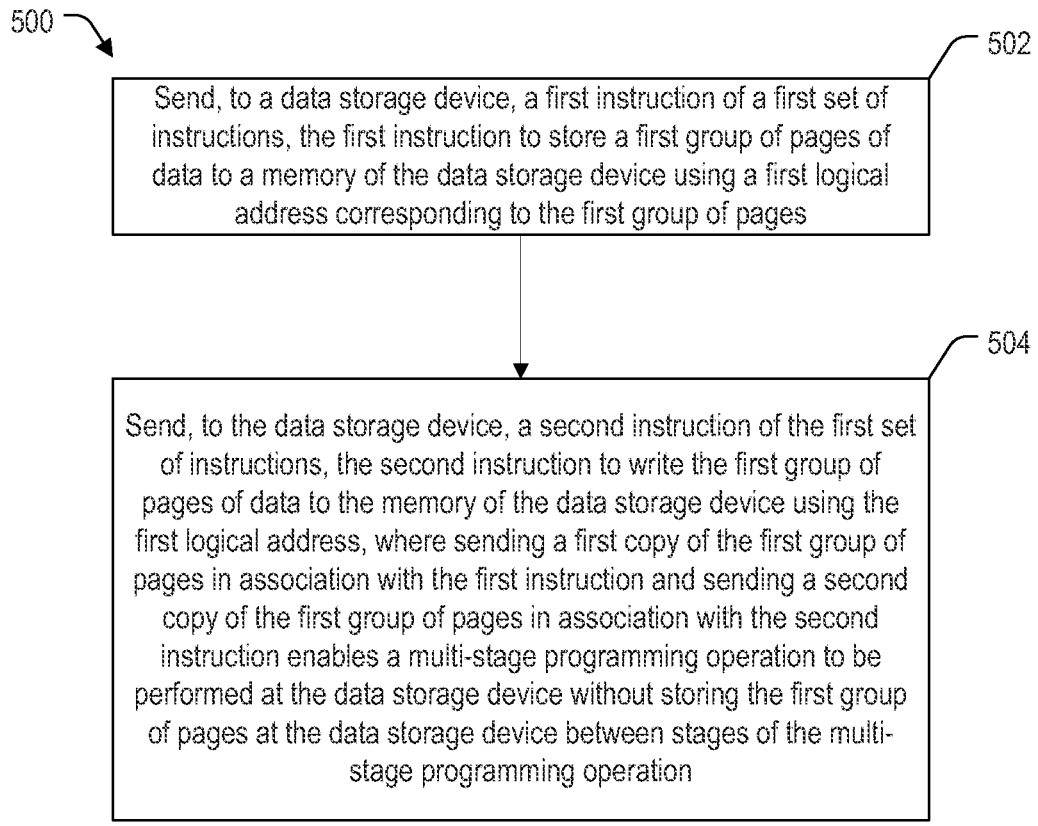
FIG. 5 is a flow chart of a particular illustrative embodiment of a method of supporting a multi-stage programming operation that may be performed by a host device in communication with the data storage device of FIG. 1.

Referring to FIG. 5, a flow chart illustrating a method 500 is shown. In particular examples, the method 500 may be performed by the host device 130 of FIG. 1. The method 500 includes sending, to a data storage device, a first instruction of a first set of instructions, at 502. The first instruction may be to store a first group of pages of data to a memory of the data storage device using a first logical address corresponding to the first group of pages. For example, the host device 130 of FIG. 1 may send (e.g., via the memory device interface 140 and the first queue 142) the first instruction 191 of the first set of instructions 190 to the data storage device 102. The first instruction 191 may be to store a first group of pages (e.g., Page 1 and Page 2) to the memory device 104 using the LBA 1 and the LBA 2 (e.g., i.e., logical block addresses corresponding to the first group of storage elements 112). The first instruction 191 may correspond to the first stage 124 of the multi-stage programming operation 122 to be performed by the controller 120 of the data storage device 102.

The method 500 further includes sending, to the data storage device, a second instruction of the first set of instructions, at 504. The second instruction may be to write the first group of pages of data to the memory of the data storage device using the first logical address. Sending a first copy of the first group of pages in association with the first instruction and sending a second copy of the first group of pages in association with the second instruction enables a multi-stage programming operation to be performed at the data storage device without storing the first group of pages at the data storage device between stages of the multi-stage programming operation. For example, the host device 130 of FIG. 1 may send (e.g., via the memory device interface 140 and the second queue 144) the second instruction 192 of the first set of instructions 190 to the data storage device 102. The second instruction 192 may be to store the first group of pages (e.g., Page 1 and Page 2) to the memory device 104 using the LBA 1 and the LBA 2 (e.g., logical block addresses corresponding to the first group of storage elements 112). The second instruction 192 may correspond to the second stage 126 of the multi-stage programming operation 122 performed by the controller 120 of the data storage device 102. Thus, the method 500 may enable a multi-stage programming operation to be performed at a data storage device without storing a group of pages at the data storage device between stages of the multi-stage programming operation.

Although various components depicted herein are illustrated as block components and described in general terms, such components may include one or more microprocessors, state machines, or other circuits configured to enable the controller 120 of FIG. 1 to associate command queues of the host device 130 with stages of the multi-stage programming operation 122 and to retrieve copies of the data from the host device for each programming stage. For example, the controller 120 may represent physical components, such as hardware controllers, state machines, logic circuits, or other structures, to enable the receipt of write instructions and pages of data from the host device 130 and scheduling of the stages of the multi-stage programming operation 122.

The multi-stage write operation 122 may be implemented using a microprocessor or microcontroller programmed to receive a write instruction from a particular command queue of a host device, retrieve data from the host device corresponding to the write instruction, and initiate a particular stage of a multi-stage programming operation using the data, and to repeat receiving the instruction (or copies of the instruction), retrieving the data (or copies of the data), and initiating stages of the multi-stage write operation until the data is fully programmed in the memory 106. In a particular embodiment, the controller 120 includes a processor executing instructions that are stored at the non-volatile memory 104. Alternatively, or in addition, executable instructions that are executed by the processor may be stored at a separate memory location that is not part of the non-volatile memory 104, such as at a read-only memory (ROM).

Semiconductor memory devices include volatile memory devices, such as dynamic random access memory ("DRAM") or static random access memory ("SRAM") devices, non-volatile memory devices, such as resistive random access memory ("ReRAM"), electrically erasable programmable read only memory ("EEPROM"), flash memory (which can also be considered a subset of EEPROM), ferroelectric random access memory ("FRAM"), and magnetoresistive random access memory ("MRAM"), and other semiconductor elements capable of storing information. Each type of memory device may have different configurations. For example, flash memory devices may be configured in a NAND or a NOR configuration.

The memory devices can be formed from passive and/or active elements, in any combinations. By way of non-limiting example, passive semiconductor memory elements include ReRAM device elements, which in some embodiments include a resistivity switching storage element, such as an anti-fuse, phase change material, etc., and optionally a steering element, such as a diode, etc. Further by way of non-limiting example, active semiconductor memory elements include EEPROM and flash memory device elements, which in some embodiments include elements containing a charge storage region, such as a floating gate, conductive nanoparticles, or a charge storage dielectric material.

Multiple memory elements may be configured so that they are connected in series or so that each element is individually accessible. By way of non-limiting example, flash memory devices in a NAND configuration (NAND memory) typically contain memory elements connected in series. A NAND memory array may be configured so that the array is composed of multiple strings of memory in which a string is composed of multiple memory elements sharing a single bit line and accessed as a group. Alternatively, memory elements may be configured so that each element is individually accessible, e.g., a NOR memory array. NAND and NOR memory configurations are exemplary, and memory elements may be otherwise configured.

The semiconductor memory elements located within and/or over a substrate may be arranged in two or three dimensions, such as a two dimensional memory structure or a three dimensional memory structure.

In a two dimensional memory structure, the semiconductor memory elements are arranged in a single plane or a single memory device level. Typically, in a two dimensional memory structure, memory elements are arranged in a plane (e.g., in an x-z direction plane) which extends substantially parallel to a major surface of a substrate that supports the memory elements. The substrate may be a wafer over or in which the layer of the memory elements are formed or it may be a carrier substrate which is attached to the memory elements after they are formed. As a non-limiting example, the substrate may include a semiconductor such as silicon.

The memory elements may be arranged in the single memory device level in an ordered array, such as in a plurality of rows and/or columns. However, the memory elements may be arrayed in non-regular or non-orthogonal configurations. The memory elements may each have two or more electrodes or contact lines, such as bit lines and word lines.

A three dimensional memory array is arranged so that memory elements occupy multiple planes or multiple memory device levels, thereby forming a structure in three dimensions (i.e., in the x, y and z directions, where the y direction is substantially perpendicular and the x and z directions are substantially parallel to the major surface of the substrate).

As a non-limiting example, a three dimensional memory structure may be vertically arranged as a stack of multiple two dimensional memory device levels. As another non-limiting example, a three dimensional memory array may be arranged as multiple vertical columns (e.g., columns extending substantially perpendicular to the major surface of the substrate, i.e., in the y direction) with each column having multiple memory elements in each column. The columns may be arranged in a two dimensional configuration, e.g., in an x-z plane, resulting in a three dimensional arrangement of memory elements with elements on multiple vertically stacked memory planes. Other configurations of memory elements in three dimensions can also constitute a three dimensional memory array.

By way of non-limiting example, in a three dimensional NAND memory array, the memory elements may be coupled together to form a NAND string within a single horizontal (e.g., x-z) memory device levels. Alternatively, the memory elements may be coupled together to form a vertical NAND string that traverses across multiple horizontal memory device levels. Other three dimensional configurations can be envisioned wherein some NAND strings contain memory elements in a single memory level while other strings contain memory elements which span through multiple memory levels. Three dimensional memory arrays may also be designed in a NOR configuration and in a ReRAM configuration.

Typically, in a monolithic three dimensional memory array, one or more memory device levels are formed above a single substrate. Optionally, the monolithic three dimensional memory array may also have one or more memory layers at least partially within the single substrate. As a non-limiting example, the substrate may include a semiconductor such as silicon. In a monolithic three dimensional array, the layers constituting each memory device level of the array are typically formed on the layers of the underlying memory device levels of the array. However, layers of adjacent memory device levels of a monolithic three dimensional memory array may be shared or have intervening layers between memory device levels.

Then again, two dimensional arrays may be formed separately and then packaged together to form a non-monolithic memory device having multiple layers of memory. For example, non-monolithic stacked memories can be constructed by forming memory levels on separate substrates and then stacking the memory levels atop each other. The substrates may be thinned or removed from the memory device levels before stacking, but as the memory device levels are initially formed over separate substrates, the resulting memory arrays are not monolithic three dimensional memory arrays. Further, multiple two dimensional memory arrays or three dimensional memory arrays (monolithic or non-monolithic) may be formed on separate chips and then packaged together to form a stacked-chip memory device.

Associated circuitry is typically required for operation of the memory elements and for communication with the memory elements. As non-limiting examples, memory devices may have circuitry used for controlling and driving memory elements to accomplish functions such as programming and reading. This associated circuitry may be on the same substrate as the memory elements and/or on a separate substrate. For example, a controller for memory read-write operations may be located on a separate controller chip and/or on the same substrate as the memory elements.

One of skill in the art will recognize that this disclosure is not limited to the two dimensional and three dimensional exemplary structures described but cover all relevant memory structures within the scope of the disclosure as described herein and as understood by one of skill in the art.

In a particular embodiment, the data storage device 102 may be implemented in a portable device configured to be selectively coupled to one or more external devices. However, in other embodiments, the data storage device 102 may be attached or embedded within one or more host devices, such as within a housing of a host communication device. For example, the data storage device 102 may be within a packaged apparatus such as a wireless telephone, a personal digital assistant (PDA), a gaming device or console, a portable navigation device, or other device that uses internal non-volatile memory. In a particular embodiment, the data storage device 102 may include a non-volatile memory, such as a three-dimensional (3D) memory, a flash memory (e.g., NAND, NOR, Multi-Level Cell (MLC), a Divided bit-line NOR (DINOR) memory, an AND memory, a high capacitive coupling ratio (HiCR), asymmetrical contactless transistor (ACT), or other flash memories), an erasable programmable read-only memory (EPROM), an electrically-erasable programmable read-only memory (EEPROM), a read-only memory (ROM), a one-time programmable memory (OTP), or any other type of memory.

The illustrations of the embodiments described herein are intended to provide a general understanding of the various embodiments. Other embodiments may be utilized and derived from the disclosure, such that structural and logical substitutions and changes may be made without departing from the scope of the disclosure. This disclosure is intended to cover any and all subsequent adaptations or variations of various embodiments.

The above-disclosed subject matter is to be considered illustrative, and not restrictive, and the appended claims are intended to cover all such modifications, enhancements, and other embodiments, which fall within the scope of the present disclosure. Thus, to the maximum extent allowed by law, the scope of the present invention is to be determined by the broadest permissible interpretation of the following claims and their equivalents, and shall not be restricted or limited by the foregoing detailed description.

What is claimed is:

1. A method comprising:
in a data storage device, performing:
receiving, from a first command queue of a host device, a first instruction of a first set of instructions to write a first group of pages of data to a memory of the data storage device;
receiving, from a second command queue of the host device, a second instruction of the first set of instructions to write the first group of pages of data to the memory of the data storage device;
performing a first stage of a first multi-stage programming operation at storage elements corresponding to a first physical address of the memory using a first copy of the first group of pages, wherein the first copy is received from the host device in association with the first instruction; and
performing a second stage of the multi-stage programming operation at the storage elements corresponding to the first physical address of the memory using a second copy of the first group of pages, wherein the second copy is received from the host device in association with the second instruction.

2. The method of claim 1, wherein the memory comprises a three bits per cell flash memory, wherein the multi-stage programming operation is a three-stage programming operation, and wherein the first group includes three pages of data.

3. The method of claim 1, further comprising:
receiving a first instruction of a second set of instructions to write a second group of pages of data to the memory; and
performing a first stage of a second multi-stage programming operation at storage elements corresponding to a second physical address of the memory using a first copy of the second group of pages, wherein the first copy of the second group of pages is received from the host device in association with the first instruction of the second set of instructions, and wherein the first stage of the second multi-stage programming operation is performed after the first stage of the first multi-stage programming operation and before the second stage of the first multi-stage programming operation.

4. The method of claim 1, wherein the first command queue and the second command queue comprise universal flash storage (UFS) command queues.

5. The method of claim 1, wherein the first group of pages of data is stored in a host memory of the host device, wherein the first copy of the first group of pages is retrieved from the host memory responsive to a first request of the data storage device, and wherein the second copy of the first group of pages is retrieved from the host memory responsive to a second request of the data storage device.

6. The method of claim 1, further comprising:
receiving, from the host device, another instruction of the first set of instructions to write the first group of pages of data to the memory of the data storage device; and
in response to a verify operation indicating that the first group of pages is not reliably stored in a multi-level cell (MLC) portion of the memory, storing another copy of the first group of pages in a single-level cell (SLC) portion of the memory, wherein the another copy is received from the host device in association with the another instruction.

7. The method of claim 1, wherein the memory includes a three-dimensional (3D) memory that is monolithically formed in one or more physical levels of arrays of memory cells having an active area disposed above a silicon substrate, and wherein the data storage device includes circuitry associated with operation of the memory cells.

8. A data storage device comprising:
a memory; and
a controller coupled to the memory, wherein the controller is configured to receive, from a first command queue of a host device, a first instruction of a first set of instructions to write a first group of pages of data to the memory and to receive, from a second command queue of the host device, a second instruction of the first set of instructions to write the first group of pages of data to the memory,
wherein the controller is further configured to perform a first stage of a first multi-stage programming operation at storage elements corresponding to a first physical address of the memory using a first copy of the first group of pages, wherein the first copy is accessible from the host device in association with the first instruction, and to perform a second stage of the multi-stage programming operation at the storage elements corresponding to the first physical address of the memory using a second copy of the first group of pages, wherein the second copy is accessible from the host device in association with the second instruction.

9. The data storage device of claim 8, wherein the memory comprises a three bits per cell flash memory, wherein the multi-stage programming operation is a three-stage programming operation, and wherein the first group includes three pages of data.

10. The data storage device of claim 8, wherein the controller is configured to receive a first instruction of a second set of instructions to write a second group of pages of data to the memory and to perform a first stage of a second multi-stage programming operation at storage elements corresponding to a second physical address of the memory using a first copy of the second group of pages, wherein the controller is configured to receive the first copy of the second group of pages from the host device in association with the first instruction of the second set of instructions, and wherein the controller is configured to perform the first stage of the second multi-stage programming operation after the first stage of the first multi-stage programming operation and before the second stage of the first multi-stage programming operation.

11. The data storage device of claim 8, wherein the first command queue and the second command queue comprise universal flash storage (UFS) command queues.

12. The data storage device of claim 8, wherein the controller is configured to receive, from the host device, another instruction of the first set of instructions to write the first group of pages of data to the memory of the data storage device and, in response to a verify operation indicating that the first group of pages is not reliably stored in a multi-level cell (MLC) portion of the memory, to store another copy of the first group of pages in a single-level cell (SLC) portion of the memory, wherein the another copy is received from the host device in association with the another instruction.

13. The data storage device of claim 8, wherein the memory includes a three-dimensional (3D) memory that is monolithically formed in one or more physical levels of arrays of memory cells having an active area disposed above a silicon substrate, and wherein the data storage device includes circuitry associated with operation of the memory cells.

14. A data storage device comprising:
a memory; and
a controller coupled to the memory, wherein the controller is configured to receive, from a host device, a first instruction of a first set of instructions to write a first group of pages of data to the memory and to receive, from the host device, a second instruction of the first set of instructions to write the first group of pages of data to the memory,
wherein the controller is further configured to perform a first stage of a first multi-stage programming operation at storage elements corresponding to a first physical address of the memory using a first copy of the first group of pages, wherein the first copy is accessible from the host device in association with the first instruction, and to perform a second stage of the multi-stage programming operation at the storage elements corresponding to the first physical address of the memory using a second copy of the first group of pages, wherein the second copy is accessible from the host device in association with the second instruction, and
wherein the controller is configured to receive a first instruction of a second set of instructions to write a second group of pages of data to the memory and to perform a first stage of a second multi-stage programming operation at storage elements corresponding to a second physical address of the memory using a first copy of the second group of pages, wherein the controller is configured to receive the first copy of the second group of pages from the host device in association with the first instruction of the second set of instructions, and wherein the controller is configured to perform the first stage of the second multi-stage programming operation after the first stage of the first multi-stage programming operation and before the second stage of the first multi-stage programming operation.

15. The data storage device of claim 14, wherein the controller is configured to receive, from the host device, another instruction of the first set of instructions to write the first group of pages of data to the memory of the data storage device and, in response to a verify operation indicating that the first group of pages is not reliably stored in a multi-level cell (MLC) portion of the memory, to store another copy of the first group of pages in a single-level cell (SLC) portion of the memory, wherein the another copy is received from the host device in association with the another instruction.

16. The data storage device of claim 15, wherein the controller is configured to receive the first instruction of the first set of instructions from a first command queue of the host device and to receive the second instruction of the first set of instructions from a second command queue of the host device.

17. A data storage device comprising:
a memory; and
a controller coupled to the memory, wherein the controller is configured to receive, from a host device, a first instruction of a first set of instructions to write a first group of pages of data to the memory and to receive, from the host device, a second instruction of the first set of instructions to write the first group of pages of data to the memory,
wherein the controller is further configured to perform a first stage of a first multi-stage programming operation at storage elements corresponding to a physical address of the memory using a first copy of the first group of pages, wherein the first copy is accessible from the host device in association with the first instruction, and to perform a second stage of the multi-stage programming operation at the storage elements corresponding to the physical address of the memory using a second copy of the first group of pages, wherein the second copy is accessible from the host device in association with the second instruction, and
wherein the controller is configured to receive, from the host device, another instruction of the first set of instructions to write the first group of pages of data to the memory of the data storage device and, in response to a verify operation indicating that the first group of pages is not reliably stored in a multi-level cell (MLC) portion of the memory, to store another copy of the first group of pages in a single-level cell (SLC) portion of the memory, wherein the another copy is received from the host device in association with the another instruction.

18. A method comprising:
in a data storage device, performing:
receiving, from a host device, a first instruction of a first set of instructions to write a first group of pages of data to a memory of the data storage device;
receiving, from the host device, a second instruction of the first set of instructions to write the first group of pages of data to the memory of the data storage device;
performing a first stage of a first multi-stage programming operation at storage elements corresponding to a first physical address of the memory using a first copy of the first group of pages, wherein the first copy is received from the host device in association with the first instruction;
performing a second stage of the multi-stage programming operation at the storage elements corresponding to the first physical address of the memory using a second copy of the first group of pages, wherein the second copy is received from the host device in association with the second instruction;
receiving a first instruction of a second set of instructions to write a second group of pages of data to the memory; and
performing a first stage of a second multi-stage programming operation at storage elements corresponding to a second physical address of the memory using a first copy of the second group of pages, wherein the first copy of the second group of pages is received from the host device in association with the first instruction of the second set of instructions, and wherein the first stage of the second multi-stage programming operation is performed after the first stage of the first multi-stage programming operation and before the second stage of the first multi-stage programming operation.

19. The method of claim 18, further comprising:
receiving, from the host device, a third instruction of the first set of instructions to write the first group of pages of data to the memory of the data storage device; and
in response to a verify operation indicating that the first group of pages is not reliably stored in a multi-level cell (MLC) portion of the memory, storing a third copy of the first group of pages in a single-level cell (SLC)

portion of the memory, wherein the third copy is received from the host device in association with the third instruction.

20. A method comprising:
in a data storage device, performing:
receiving, from a host device, a first instruction of a first set of instructions to write a first group of pages of data to a memory of the data storage device;
receiving, from the host device, a second instruction of the first set of instructions to write the first group of pages of data to the memory of the data storage device;
performing a first stage of a first multi-stage programming operation at storage elements corresponding to a physical address of the memory using a first copy of the first group of pages, wherein the first copy is received from the host device in association with the first instruction;
performing a second stage of the multi-stage programming operation at the storage elements corresponding to the physical address of the memory using a second copy of the first group of pages, wherein the second copy is received from the host device in association with the second instruction;
receiving, from the host device, a third instruction of the first set of instructions to write the first group of pages of data to the memory of the data storage device; and
in response to a verify operation indicating that the first group of pages is not reliably stored in a multi-level cell (MLC) portion of the memory, storing a third copy of the first group of pages in a single-level cell (SLC) portion of the memory, wherein the third copy is received from the host device in association with the third instruction.

* * * * *